July 6, 1965 J. E. CLARK 3,193,366

SEMICONDUCTOR ENCAPSULATION

Filed July 12, 1961

INVENTOR
J. E. CLARK
BY H. W. Lockhart
ATTORNEY 3,193,366
Patented July 6, 1965

3,193,366

SEMICONDUCTOR ENCAPSULATION

James E. Clark, Coopersburg, Pa., assignor to Bell Telephone Laboratories, Incorporated, New York, N.Y., a corporation of New York Filed July 12, 1961, Ser. No. 123,463
2 Claims. (Cl. 65—54)

This invention relates to electrical element encapsulation. More particularly, this invention relates to a method for encapsulating a semiconductor element in glass.

In this connection, a semiconductor element is a semiconductor wafer and includes at least two electrode connections thereto.

Even a casual reflection of the semiconductor art serves to emphasize the problems involved and the expense undergone in the development of semiconductor element encapsulations. However, a recognition of the minute dimensions typical of semiconductor elements and the need to handle these elements points up in a more cogent manner the necessity for a suitable package or encapsulation and some of the requirements for such a package.

It is required of a semiconductor element package that it be physically strong and stable, provide a suitable environment for the enclosed element, and provide suitable insulated conduits for the lead wires extending through it.

An object of this invention is an inexpensive encapsulation which fulfills the above requirements.

Some success in the use of glass for an element encapsulation is in evidence in the art. Semiconductor elements have been dipped into a glass melt and subsequently cooled. The glass provided a reasonably strong encapsulation. However, the temperatures (typically in excess of 1,000 degrees centigrade) required to melt the glass also affected deleteriously the characteristics of the resulting device. The use of low melting glasses typically introduces other problems.

A further object of this invention is a process which permits the semiconductor elements to be encapsulated in glass at temperatures which little affect their operating characteristics without introducing other problems.

This invention is based on providing cooperation of the piece parts which are to constitute a semiconductor device in turning to account an ambient gas pressure to provide quickly and at about softening point temperatures a glass encapsulation.

Accordingly, one feature of this invention is the use of an ambient gas pressure to reduce the processing temperatures of glass encapsulating techniques.

Another feature is that the glass encapsulation is in the form of a solid sleeve which remains substantially solid throughout the encapsulation process.

A further feature is the physical arrangement and shape of the piece parts of the device for cooperating with the gas pressure to provide a metal-to-glass seal at relatively low temperatures.

In one specific embodiment of this invention a semiconductor element is positioned on the extreme end of the shank portion of a shouldered metal stud. A tight-fitting glass sleeve then is positioned around and extending beyond the shank portion of the stud. The shank portion of a second shouldered metal stud is inserted into the extended portion of the glass sleeve fixing the position of the semiconductor element between the extreme ends of the two shank portions and fixing the position of the glass sleeve between the two shouldered portions. The resulting arrangement is first heated sufficiently for forming a glass-to-metal seal about the edge of the glass sleeve. Thereafter, the ambient pressure is increased for creating a pressure differential between the inside and the outside of the sleeve. After a pressure differential has been established, the arrangement is heated slightly above the softening point temperature of the glass. The pressure differential causes substantial collapse of the glass sleeve about the semiconductor element and the surface of the shank portion of the shouldered studs. Temperatures involved in such an assembly process can be sufficiently low as not to affect the electrical characteristics of the device.

The invention and its objects and features will be understood more fully from the following detailed description rendered in conjunction with the accompanying drawing, in which.

It is to be understood that the figures are not necessarily to scale, certain dimensions being exaggerated to better illustrate the nature of the invention.

Figure 1:
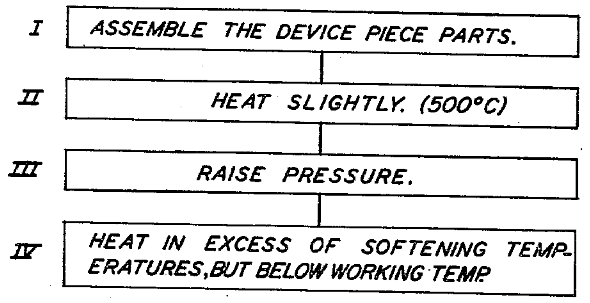
FIG. 1 is a flow diagram illustrating the steps of the method of this invention.

With specific reference to FIG. 1, step I includes the assembly of the various constituent elements or piece parts of the final device. As will become more apparent below, the arrangement of the elements is important for utilizing the gas pressure to advantage. The process is carried out conveniently in an enclosure 10 shown in FIG. 2 suitable for maintaining the required pressures, acess means being provided therein for a flow of a suitable inert ambient gas such as argon, nitrogen or helium from a recirculating and pumping means (not shown). The semiconductor element 12, typically a silicon wafer, is placed on the extreme end of the shank portion 13 of an upended metallic shouldered stud 14. The stud advantageously is made of conductive electrode metal such as Kovar or No. 52 alloy. (Kovar contains nominally 29% nickel, 17% cobalt, 0.3% manganese and the balance iron; and No. 52 alloy contains approximately 50% each of nickel and iron.) The glass sleeve 16 is positioned to encompass the shank 13 and the semiconductor wafer 12 and to extend beyond the shank a distance slightly longer than the shank portion itself. The shank portion 18 of the shouldered stud 19 is inserted into the open end 20 of the glass sleeve 16, fixing the position of the semiconductor element 12 therebetween as shown in FIG. 3. Also, the position of the glass sleeve 16 is fixed thereby simultaneously.

The assembly is then heated as illustrated by step II of FIG. 1. Preferably, the increase in temperature is provided by passing an electrical current through the heating coil 21 positioned radially with respect to the glass sleeve. This arrangement has the advantage of localizing the relatively low temperature increases required and thus minimizing the effect of any thermal mismatches between the piece parts. Characteristically, a temperature is provided suitable both for forming an initial seal during this step as stated above but also for outgassing the glass. This can be done at a relatively low temperature. Subsequently, after a seal is made, the ambient gas pressure is increased from atmospheric pressure to an elevated pressure whereafter the temperature is elevated to typically between the softening point and the working point temperatures as indicated by steps III and IV. In this connection, glass, which may be considered a liquid at all temperatures, has a viscosity at room temperature such as to appear solid. The softening point temperature, then, is the temperature at which glass appears to start melting. At this temperature the viscosity of the glass typically is $10^{7.65}$ poises and the glass starts to sag of its own weight. The working point is the temperature at which the glass has a viscosity of $10^4$ poises and corresponds to the temperature at which the glass is readily worked. These definitions are in accordance with standards set by the American Society for Testing Materials (ASTM).

Typical glasses useful in accordance with this invention include Corning glasses Nos. 0120 and 7052 which have a softening point temperature of 630 and 710 degrees centigrade, respectively, and a working point of between 980 and 1135 degrees centigrade. A typical final sealing temperature in accordance with this invention is in the range of 650 to 750 degrees centigrade. This is the maximum temperature needed for the encapsulation. By way of distinction, prior art glass encapsulation processes typically involve heating to temperatures of the order of 900 degrees centigrade.

Figure 2:
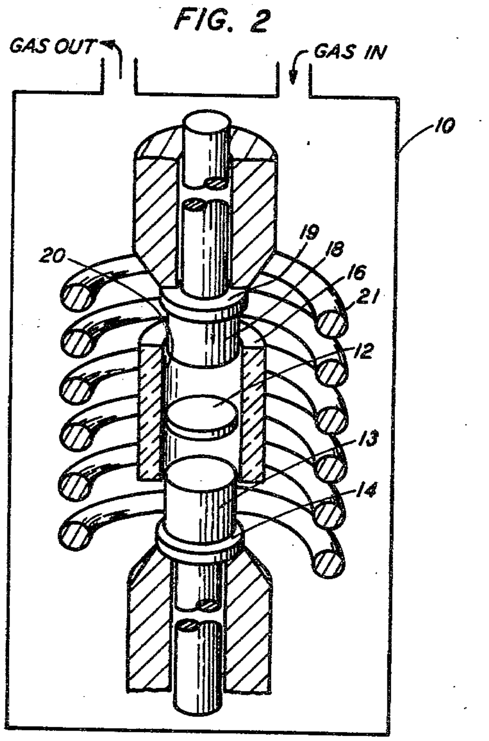
FIG. 2 is an exploded perspective view partially in cross section of the parts of the sealing apparatus and a device to be assembled in accordance with the method of FIG. 1.
Figure 3:
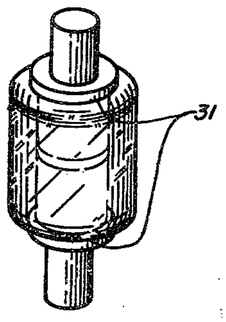
FIG. 3 is a perspective view of the finished device fabricated in accordance with the method of FIG. 1.

The arrangement of the elements of FIG. 2 is particularly adapted for using the ambient gas pressure to advantage. In particular, the piece parts to constitute the finished device are arranged to utilize the gas pressure to form initially a first seal along surfaces 31 of FIG. 3 at low pressure and temperature. Subsequently, a pressure differential between the pressure within the glass sleeve and the increasing ambient pressure is developed for deforming inwardly the glass sleeve at temperatures substantially reduced from those required by the prior art. Accordingly, a second more extensive glass-to-metal seal is formed as described above and the device is completed.

It is seen then that the physical shape of the individual piece parts is important. Specifically, the shouldered studs or electrodes to the semiconductor wafer should have a T shape to provide a surface for abutting the edge of the glass sleeve and thus terminating the advance of electrodes caused by the increasing gas pressure. Correspondingly, the glass sleeve has a minimum length equal to twice the length of the shanks of the studs plus the thickness of the semiconductor wafer or the initial seal, a prerequisite for successful encapsulation in accordance with this invention, does not form.

In practice, glass sleeves with uneven edges are encountered frequently. In such cases it is desirable to direct a mechanical force of about 25 grams inwardly along the longitudinal axis of the studs for forming the initial seal.

Under certain conditions it may be desirable to pre-seal the glass sleeve to the shoulder of one stud. Since this step can be done before positioning the semiconductor wafer, no harm attends the temperatures necessary to melt the glass and provide a seal. After such a seal is provided and the semiconductor wafer is seated, the remainder of the assembly and process is as described above. However, the gas pressure now results in an increased mechanical force on the second stud to enable a seal to form between the second stud and the open end of the glass sleeve.

A semiconductor diode has been encapsulated in accordance with this invention as follows:

A disk-shaped semiconductor wafer having a diameter of .040 inch and a thickness of .007 inch was positioned on an upended stud, encompassed by a tight-fitting glass sleeve and secured by a second stud as described above. The wafer included two contiguous regions of opposite conductivity type and defined a PN junction therebetween. The Kovar studs were identical, having a shoulder portion about .050 inch in diameter and a shank portion .040 inch in diameter and .050 inch long. The sleeve, which was of Corning glass No. 0120, had softening and working points of 630 and 980 degrees centigrade, respectively, and had the dimensions .112 inch long with an internal diameter of .040 inch. The assembled structure was heated initially to a temperature of 500 degrees centigrade for about one minute and then an initial pressure of 25 grams was applied longitudinally from opposite ends. The surrounding argon gas pressure immediately thereafter was increased to 75 pounds per square inch and maintained about five seconds for providing a force of 40 grams. During this time, the temperature was increased to, and maintained at, 650 degrees centigrade for a total heat cycling time of about fifteen seconds.

No effort has been made to exhaust the possible embodiments of the invention. It will be understood that the embodiment described is merely illustrative of the preferred form of the invention and various modifications may be made therein without departing from the spirit and scope of this invention.

What is claimed is:

1. A method for encapsulating a semiconductor element, said method comprising the steps of positioning at atmospheric pressure and room temperature a semiconductor element on the extreme end of the shank portion of a shouldered stud, placing a tight-fitting glass sleeve over the shank portion of said stud, said glass sleeve having a length slightly greater than twice that of said shank portion, inserting the shank portion of a second shouldered stud into the opposite end of said glass sleeve, heating to about 500 degrees centigrade for approximately one minute, applying an initial force of about 25 grams directed inwardly on said shouldered studs, increasing the ambient gas pressure to about 75 pounds per square inch, and heating for a time for a time at a temperature in the range from about 650 degrees to 750 degrees centigrade for less than one minute to produce a seal along the entire shank of both studs and the edge of the semiconductor element, said temperature being substantially less than the working point temperature of said glass sleeve.

2. A method for encapsulating a semiconductor element, said method comprising the steps of positioning at atmospheric pressure and room temperature a semiconductor element on the extreme end of the shank portion of a shouldered stud, placing a tight-fitting glass sleeve over the shank portion of said stud, inserting the shank portion of a second shouldered stud into the opposite end of said glass sleeve, said glass sleeve having a length slightly greater than the sum of the shank portion lengths, heating to about 500 degrees centigrade for approximately one minute, increasing the ambient gas pressure to about 75 pounds per square inch, and heating at a temperature in the range from about 650 degrees to 750 degrees centigrade for less than one minute to produce a seal along the entire shank of both studs and the edge of the semiconductor element, said temperature being substantially less than the working point temperature of said glass sleeve.

References Cited by the Examiner

UNITED STATES PATENTS

| | | | |
|---|---|---|---|
| 1,395,963 | 11/21 | Kuppers | 65—59 |
| 2,477,372 | 7/49 | Herzog | 316—19 X |
| 2,552,653 | 5/51 | Stupakoff | 317—242 |
| 2,817,797 | 12/57 | Coyle | 317—234 |
| 2,863,105 | 12/58 | Ross | 317—234 |
| 2,964,831 | 12/60 | Peterson | 29—25.3 |
| 2,996,347 | 8/61 | McCullough | 316—19 |
| 3,032,941 | 5/62 | Korbitz | 53—22 |
| 3,064,341 | 11/62 | Masterson | 29—25.3 |
| 3,080,738 | 3/63 | Frazier | 29—25.3 |

RICHARD H. EANES, Jr., *Primary Examiner.*

JAMES D. KALLAM, *Examiner.*